US012300578B2

(12) United States Patent
Nootens et al.

(10) Patent No.: US 12,300,578 B2
(45) Date of Patent: May 13, 2025

(54) ALUMINUM NITRIDE MULTILAYER POWER MODULE INTERPOSER AND METHOD (71) Applicant: TRIPENT POWER LLC, San Diego, CA (US)

(72) Inventors: Stephen P. Nootens, San Diego, CA (US); Frank J. Polese, San Diego, CA (US); Steven S. Scrantom, San Diego, CA (US)

(73) Assignee: TriPent Power LLC, San Diego, CA (US)

( * ) Notice: Subject to any disclaimer, the term of this patent is extended or adjusted under 35 U.S.C. 154(b) by 610 days.

(21) Appl. No.: 17/631,466

(22) PCT Filed: Jul. 31, 2020

(86) PCT No.: PCT/US2020/044480
§ 371 (c)(1),
(2) Date: Jan. 29, 2022

(87) PCT Pub. No.: WO2021/022150
PCT Pub. Date: Feb. 4, 2021

(65) Prior Publication Data
US 2022/0278021 A1  Sep. 1, 2022

Related U.S. Application Data (60) Provisional application No. 62/881,264, filed on Jul. 31, 2019.

(51) Int. Cl.
H01L 23/467    (2006.01)
H01L 21/48     (2006.01)
(Continued)

(52) U.S. Cl.
CPC ........ *H01L 23/467* (2013.01); *H01L 21/4857* (2013.01); *H01L 21/486* (2013.01);
(Continued)

(58) Field of Classification Search
CPC . H01L 23/467; H01L 23/15; H01L 23/49822; H01L 23/49833;
(Continued)

(56) References Cited

U.S. PATENT DOCUMENTS 5,904,499 A    5/1999  Pace
6,875,921 B1   4/2005  Conn
(Continued)

OTHER PUBLICATIONS

International Search Report and Written Opinion for PCT/US2020/044480 dated Nov. 23, 2020, 19 pages.

*Primary Examiner* — Peniel M Gumedzoe
(74) *Attorney, Agent, or Firm* — Charmasson, Buchaca & Leach, LLP (57) ABSTRACT A power electronic interposer (10) for mounting a number of power transistor integrated circuit dice (14) can be made from a multi-layer ceramic process to provide an aluminum nitride body (11) having internal tungsten traces (30-35) to electrically connect die bond pads (17,18) to interposer contact pads (25,26) allowing connection to circuitry off of the interposer. The traces can include one or more groupings of parallelly spaced apart conductive vias (30,31) that are connected in an electrically parallel manner to reduce electrical resistance and inductance in the circuitry. A network of cooling conduits and optional resistance temperature detector traces can be run through other parts of the body to provide controlled active cooling. The interposer can be formed separate ceramic bodies bonded together, to package the dice.

20 Claims, 6 Drawing Sheets (51) Int. Cl.
*H01L 23/00* (2006.01)
*H01L 23/15* (2006.01)
*H01L 23/498* (2006.01)
*H01L 25/11* (2006.01)

(52) U.S. Cl.
CPC ........ *H01L 23/15* (2013.01); *H01L 23/49822* (2013.01); *H01L 23/49833* (2013.01); *H01L 23/49844* (2013.01); *H01L 23/49866* (2013.01); *H01L 24/08* (2013.01); *H01L 25/115* (2013.01); *H01L 2224/08238* (2013.01)

(58) Field of Classification Search
CPC ......... H01L 23/49844; H01L 23/49866; H01L 21/4857; H01L 21/486; H01L 24/08; H01L 25/115; H01L 2224/08238
See application file for complete search history.

(56) References Cited

U.S. PATENT DOCUMENTS

| | | | |
|---|---|---|---|
| 2003/0089521 A1* | 5/2003 | Lee | H05K 3/243 |
| | | | 174/250 |
| 2005/0236180 A1* | 10/2005 | Sarma | H05K 3/4629 |
| | | | 257/E23.113 |
| 2008/0150162 A1* | 6/2008 | Koizumi | H01L 23/473 |
| | | | 257/E23.098 |
| 2008/0191342 A1 | 8/2008 | Otremba | |
| 2008/0308917 A1 | 12/2008 | Pressel et al. | |
| 2013/0292849 A1 | 11/2013 | Lin et al. | |
| 2014/0308787 A1 | 10/2014 | Kocon | |
| 2015/0016083 A1 | 1/2015 | Nootens et al. | |
| 2015/0084206 A1 | 3/2015 | Lin | |
| 2016/0366762 A1 | 12/2016 | Lin et al. | |
| 2018/0116055 A1* | 4/2018 | Murakami | H05K 1/111 |
| 2018/0122720 A1 | 5/2018 | Hable et al. | |
| 2019/0103336 A1 | 4/2019 | Wu et al. | |
| 2019/0131287 A1 | 5/2019 | Huang et al. | |

* cited by examiner

ALUMINUM NITRIDE MULTILAYER POWER MODULE INTERPOSER AND METHOD

PRIOR APPLICATION

This application claims the benefit of U.S. Provisional Patent Application Ser. No. 62/881,264, filed 2019 Jul. 31 incorporated herein by reference.

FIELD OF THE INVENTION

The instant invention relates to microelectronics manufacturing and more particularly to packaging, support, and interconnecting structures for integrated circuit power electronic components.

BACKGROUND

The microelectronics industry is constantly striving for further miniaturization of components to increase speed and functionality of electronic systems. This has led to the fabrication of highly complex integrated circuits (ICs) on chips of semiconductors such as silicon. In order to more effectively electrically connect and power these chips used in many small electronic systems such as mobile phones, many processing techniques and highly specialized apparatuses have been developed.

One important area for design involves power electronics. Many consumer electronic systems such as mobile phones have circuitry which operates using relatively high power such as between about 3000 W and 7500 W. However, the components in such systems are often designed to operate well under 100° C. Thus, thermal management can become a guiding if not over-riding design concern. Other industries using high power electrical motors such as manufacturing and electric drive automobiles require efficient high power management in small spaces.

High power circuitry often uses insulated-gate bipolar transistors ("IGBT") and high power field effect transistors such as metal oxide semiconductor field effect transistors ("MOSFET") to accomplish the necessary switching and amplification of signals. Such devices have been made using a number of materials such as silicon for the semiconductor. More recently, silicon carbide ("SiC") and gallium nitride ("GaN") have shown promise in higher power applications as disclosed in Klowak et al., U.S. Pat. No. 9,659,854.

Many potential problems are faced by a designer of semiconductor power device packaging and interconnection structures. Areas of particular consideration include the use of materials and structures which offer the often countervailing requirements of high temperature tolerance, high electrical conductivity, high thermal conductivity, low thermal expansion, low material reactance with its intended environment, high resistance to mechanical shock, low electrical inductance, and simplicity of manufacturing including good machine-ability, reduced brittleness, ready material availability, low cost, acceptable toxicity, high hermeticity, and achievability of necessary mechanical tolerances, to name a few. Obviously, trade-offs are necessary. And, the ability to readily predict whether a design will work adequately is essentially impossible. Design is therefore fraught with experimentation and failure.

For thermal management purposes the architecture of power transistors can vary greatly.

An important consideration involves the potential thermal expansion mismatches between the ceramic substrate and any metalization. The coefficient of thermal expansion (hereinafter sometimes referred to as "CTE") or simply the thermal expansion of a material is defined as the ratio of the change in length per degree Centigrade to the length at 25 degrees C. It is usually given as an average value over a range of temperatures.

Another consideration involves the thermal conductivity of the materials used, especially those that are subjected to high heat. The thermal conductivity (hereinafter sometimes referred to as "K" or "TC") of a material is defined as the time rate of heat transfer through unit thickness, across unit area, for a unit difference in temperature or K=WL/AT where W=watts, L=thickness in meters, A=area in square meters, and T=temperature difference in degrees centigrade. A more highly thermally conductive structure will tend to carry unwanted heat away from the heat-generating dice.

Another potential problem involves different power electronic integrated circuit chips known as dice having different masses, geometries, power requirements. This often results in dice having far different heat and inductance management requirements which in turn can lead to requiring many different types of packages and interfacing structures such as interposers. It would be advantageous to provide a single type of mounting structure which can accommodate many types of dice, and can be readily configured to accommodate different die types.

In general, multi-layer ceramic (hereinafter sometimes referred to as "MLC") technology involves mixing particles of high temperature-withstanding dielectric material such as alumina with an organic binder, which is then tape-cast, dried and separated into a number of flexible "green sheets". Some of the sheets are screened and printed with metalization and other circuit patterns which, when stacked in alignment with other sheets, can form intricate three-dimensional internal electronic interconnects. The stacked sheets are laminated together at a predetermined temperature and pressure, and then slowly heated in a binder burn-off routine to about 400 degrees C. which vaporizes off a majority of the binder material. The resultant fragile baked out or debound part is then fired at an elevated temperature routine, typically reaching 1,600 degrees C. for alumina ceramic in a reducing atmosphere such as humidified hydrogen-nitrogen upon which any residual amount of the binder material vaporizes off while the remaining material fuses or sinters into a solid ceramic body having metal electrical circuitry coursing therethrough. Where alumina is generally used as the electrically insulating material, and refractory metals such as tungsten (hereinafter sometimes referred to as "W") and molybdenum (hereinafter sometimes referred to as "Mo") can be used for the internal metalization. However, because tungsten oxidizes readily during co-firing processes involving free oxygen, care must be taken to hermetically isolate tungsten traces. During sintering the body typically shrinks about 15 to 18% where alumina is the ceramic material. External metalization, such as copper contact pads, forms electrical contact with exposed surfaces of the internal metalization, and seals those surfaces from the outside environment.

Aluminum Nitride (hereinafter sometimes referred to as "AlN") has been used as the ceramic in prior MLC electronics as shown in Harris, et al., U.S. Pat. No. 9,340,462. AlN provides a thermal conductivity of about 180 W/mK. The thermal expansion of tungsten and AlN are similar at approximately 4.5 ppm/degree C. Further AlN can readily form hermetic structures using MLC technology. For a MLC structure formed using AlN as the ceramic, shrinkage during sintering is typically between about 17% and 23%.

The instant invention results from efforts to provide an improved microelectronic interposer which addresses some or all of the above identified problems.

SUMMARY

The primary and secondary objects of the invention are to provide an improved electronic power module interposer. These and other objects are achieved by creating a multi-layer ceramic interposer having high current-carrying internal metalization.

The content of the original claims portion is incorporated herein by reference as summarizing features in one or more exemplary embodiments.

In some embodiments there is provided a solid state power electronic apparatus for mounting at least one power electronic die, said apparatus comprises: a ceramic body; a platform on a first surface of said body; said platform including a first metal pad oriented to electrically contact said die; a second metal pad on a second surface of said body spaced apart from said first surface; a first set of plural electrically conductive traces running internally through said body electrically connected between said first metal pad and said second metal pad; wherein said first set of plural electrically conductive traces comprise a first array of spaced apart vias; wherein each of said vias are connected to one another in an electrically parallel circuit configuration; and, wherein said second metal pad provides an electrical contact to circuitry off said body.

In some embodiments said ceramic body comprises aluminum nitride and said first set of a plurality of electrically conductive traces comprise tungsten.

In some embodiments said platform is formed within a cavity on said body.

In some embodiments at least one of said first set of plural electrically conductive traces has a first portion and a second portion adjacent to said first portion; wherein said first and second portions extend through an internal section of said body; and, wherein said first portion is substantially orthogonal to said second portion.

In some embodiments said first array of spaced apart vias is two dimensional.

In some embodiments said first array has a size of at least 2×6.

In some embodiments said first set of plural electrically conductive traces further comprises a plurality of lateral strips extending through said body, wherein a first one of said vias and a first one of said strips are electrically connected and are arranged in a non-linear physical shape.

In some embodiments a cross-sectional area of a first one of said strips taken perpendicular to a current flow through said first one of said strips is greater than a cross-sectional area of said first one of said vias taken perpendicular to a current flow through said first one of said vias.

In some embodiments said apparatus further comprises: a third metal pad on a third surface of said body spaced apart from said first and second surfaces; a second set of plural electrically conductive traces running internally through said body electrically connecting said second metal pad with said third metal pad; and, wherein said second set of plural electrically conductive traces comprise a second array of spaced apart vias connected in an electrically parallel circuit configuration.

In some embodiments said apparatus further comprises: a heat management structure contacting said third metal pad; and, wherein said heat management structure is selected from the group consisting of: a heat sink, a radiator, and a cooling fan.

In some embodiments said third metal pad is electrically connected to a transistor source electrode or drain electrode on said die.

In some embodiments said apparatus further comprises: said body being formed by a sintered plurality of multilayer ceramic layers comprising: aluminum nitride; and, said first set of plural electrically conductive traces comprising tungsten; and, at least one hollow conduit extending through a plurality of adjacently stratified ones of said layers, wherein said at least one conduit carries a cooling fluid.

In some embodiments said first metal pad comprises an outer layer comprising copper and an inner adhering layer comprising nickle.

In some embodiments said apparatus further comprises: said ceramic body being a first ceramic body; a second ceramic body bonded to said first ceramic body along a bond interface; wherein said bond interface comprises a plurality of metal pads electrically connecting said first ceramic body to said second ceramic body; and, wherein said bodies substantially enclose said die.

In some embodiments said apparatus further comprises a resistance temperature detector trace coursing through said body.

In some embodiments said apparatus further comprises: a second array of spaced apart thermally conductive vias; a network of hollow conduits extending through said body; wherein said network carries a flow of cooling fluid; and, wherein said second array is interleaved with said network.

In some embodiments said cooling fluid comprises air.

In some embodiments said apparatus further comprises a tungsten snubber circuit element electrically connected to said to said first set of plural electrically conductive traces.

In some embodiments said apparatus further comprises second set of traces interleaved with said first set of traces; and wherein set first set of traces routes a current in a first direction and wherein said second set of traces routes said current in a second direction opposite said first direction.

In some embodiments there is provided a solid state power electronic interposer for mounting one or more dice, said interposer comprises: an aluminum nitride body having a die-contacting platform; said platform including a first pad; a second pad located on a surface of said body apart from said platform; wherein both of said pads are electrically conductive; a first plurality of spaced apart tungsten interconnects coursing through said aluminum nitride body; and, wherein said first plurality of tungsten interconnects directly electrically connects said first electrical pad to said second electrical pad in an electrically parallel circuit configuration.

In some embodiments it is provided that in a solid state power electronic package having an interposer electrically connecting at least one high power integrated circuit die, wherein said interposer includes a first electrical pad contacting said die and a second electrical pad located on a surface of said interposer apart from said die; an improvement which comprises: said interposer comprising: a first monolithic aluminum nitride body; a first plurality of spaced apart tungsten interconnects coursing through said body; and, wherein said tungsten interconnects electrically connect said first electrical pad directly to said second electrical pad in an electrically parallel circuit configuration.

In some embodiments there is provided a method for manufacturing a solid state power electronic interposer for mounting one or more integrated circuit dice, said method comprises: selecting a monolithic, multilayer ceramic aluminum nitride interposer body having an resistance temperature detector sensor trace and a cooling conduit running through the body; sensing a temperature of said interposer using said resistance temperature detector sensor trace; and, adjusting a flow of cooling fluid through said cooling conduit in response to said temperature.

In some embodiments said cooling conduit runs between a pair of heat conductive vias extending through said body.

DESCRIPTION OF THE EXEMPLARY EMBODIMENTS

Figure 1:
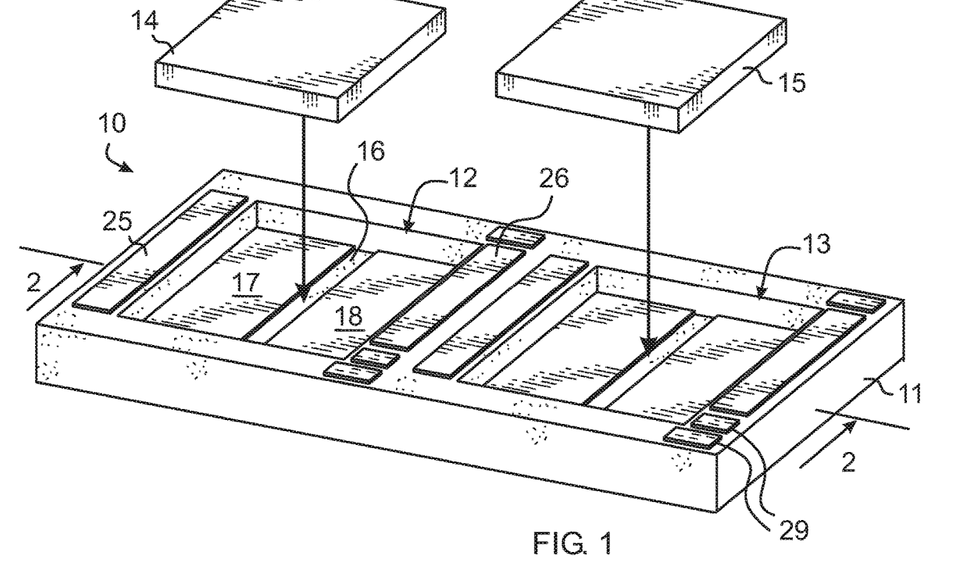
FIG. 1 is a diagrammatic perspective view of an interposer for mounting a pair of high power transistors according to an exemplary embodiment of the invention.

In this specification, the references to top, bottom, upward, downward, upper, lower, vertical, horizontal, sideways, lateral, back, front, etc. can be used to provide a clear frame of reference for the various structures with respect to other structures while the framework is as shown in FIG. 1, and not treated as absolutes when the frame of reference is changed, such as when the framework is inverted or disassembled.

The term "substantially" can be used in this specification because manufacturing imprecision and inaccuracies can lead to non-symmetricity and other inexactitudes in the shape, dimensioning and orientation of various structures. Further, use of "substantially" in connection with certain geometrical shapes and orientations, such as "parallel" and "perpendicular", can be given as a guide to generally describe the function of various structures, and to allow for slight departures from exact mathematical geometrical shapes and orientations, while providing adequately similar function. Those skilled in the art will readily appreciate the degree to which a departure can be made from the mathematically exact geometrical references.

The exemplary embodiment of the invention will be described by way of example in the manufacture of a power electronic device interposer, specifically, a structure mounting and electrically interconnecting a lateral power transistor.

Thus, a power electronic interposer substrate can be made primarily out of a ceramic material such as aluminum nitride ("AlN") ceramic having a plurality of metallized electrically conductive traces made out of a material such as tungsten ("W").

The substrate can be manufactured using a multi-layer ceramic ("MLC") process including the steps of tape casting, blanking, screening, metalization, stacking, laminating, debinding, sintering, flatfiring, lapping, polishing, grinding, plating, and brazing for example.

Referring now to drawing, there is shown in FIGS. 1-4 an improved power transistor interposer 10 including a substrate formed by an electrically insulating monolithic ceramic body 11 having a cavity or cavities 12,13 each of which can mount at least one power transistor die 14,15. The surface of the base of each cavity forms a platform 16 upon which a die 14 can be mounted. The platform includes a number of electrically conductive die bond pads 17,18. In this case of a power transistor, the die bond pads can be a source pad 17 electrically contacting a source electrode 21 on the die, and a drain pad 18 electrically contacting a drain electrode 22 on the die.

Figure 2:
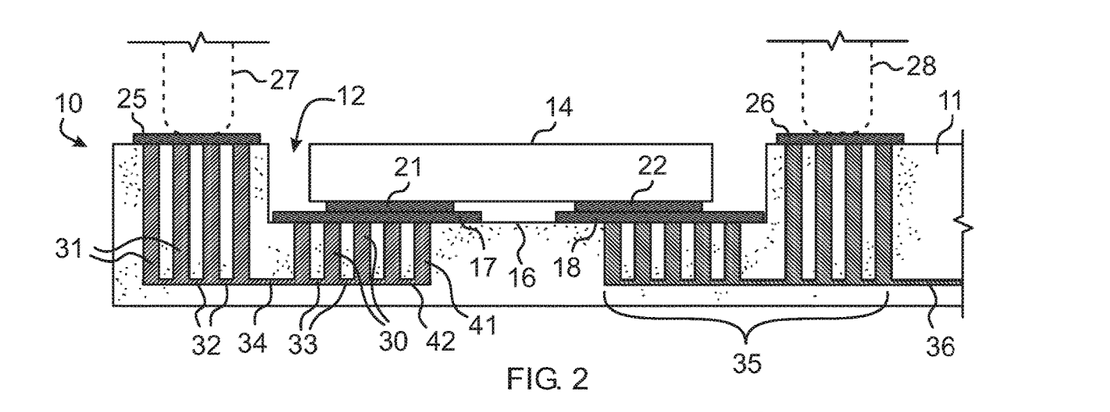
FIG. 2 is a diagrammatic partial cross-sectional side view of the interposer of FIG. 1 taken along line 2-2.

As will be described further below, the die bond pads 17,18 can be electrically connected internally through the interposer to corresponding electrically conductive interposer contact pads 25,26 located on another surface of the interposer body 11 spaced apart from the surface upon which the die bond pads reside. The interposer contact pads provide electrical connectivity to circuitry off of the interposer body by providing contact to electrically conductive pins 27,28, wire bonding, surface mounting to corresponding pads on a printed circuit board, or other conductive structures. Other pads 29 can be formed on the remaining surfaces of the body as needed with or without internal electrical interconnects for mounting control circuitry such as gate drivers.

Direct electrical connection between a die bond pad 17 and a corresponding interposer contact pad 25 can be through a first set of electrically conductive interconnects or traces 30-34 coursing through the internal structure of the interposer body 11. A second set of traces 35 can similarly connect the drain die bond pad 18 to the interposer contact pad 26 corresponding to the drain. The traces can be formed by metalization of the ceramic body. For an AlN body, the traces can be made of tungsten, while the external pads can be formed using plated or un-plated tungsten, copper, silver, silver palladium or other conductive material that does not oxidize so readily as tungsten.

The first set of plural electrically conductive traces 30-34 running internally through the body 11 can include a first grouping of a plurality of substantially vertical, spaced apart vias 30 which in this embodiment form substantially cylindrical, pillar-like structures extending downward from the die bond pad 17, a second grouping of a plurality of substantially vertical spaced apart vias 31 extending downward from the interposer contact pad 25, and a third grouping of a plurality of laterally extending strips 32,33,34 that electrically connect to the vias. The second set of traces 35 can be connect the drain die bond pad 18 to the drain interposer contact pad 26 in a similar manner as the first set of traces connected their respective pads. One or more internal interconnecting traces 36 can electrically connect to other traces on the interposer (not shown) and/or to contact pads connecting to circuitry off of the interposer body. Therefore, each grouping of vias can be connected in an electrically parallel manner.

Figure 3:
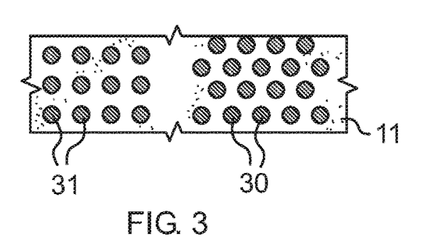
FIG. 3 is a diagrammatic partial cross-sectional top view of a portion of the interposer of FIG. 1 showing groupings of vias in both square packed and triangular packed arrangements.

As shown in FIG. 3, each grouping of electrically parallel vias 31 can be substantially uniformly shaped and dimensioned, and arranged in a substantially physically parallel, substantially uniformly spaced apart array that is two dimensional and arranged in a square packed manner. Alternately, for greater density a grouping 30 of electrically parallel vias can be packed in a triangularly packed manner. However, such density may lead to an unwanted weakening of the green tape to stretching forces in certain directions that could lead to tears during fabrication. Therefore, it is important to note that, as used in this specification, the term "array" can mean a one or two dimensional grouping, and can have substantially evenly spaced apart rows and columns where each successive row or column is substantially linearly arranged having equal numbers of substantially evenly spaced apart vias, or can have non-evenly spaced apart rows and columns, that may or may not be linearly arranged, nor have equal numbers of vias, that may or may not be evenly spaced apart. In other words, the array of vias can be two dimensional without requiring equal numbers of vias in each of the respective columns or rows.

Figure 4:
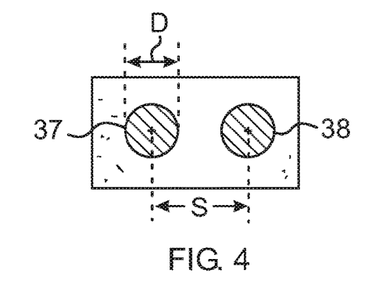
FIG. 4 is a diagrammatic partial cross-sectional top view of a pair of adjacent vias showing diameter and spacing.

As shown in FIG. 4, a single substantially cylindrical via 37 can have a diameter D and have a center-to-center spacing S form an adjacent via 38. The number, arrangement, dimensioning, and spacing of a grouping of electrically parallel vias will depend on the internal geometries of the interposer, circuit layout and manufacturing limitations. For example, a larger number of smaller, more closely spaced vias may be impractical due to inaccuracies in the stacking alignment of the green tape sheets.

It has been found that for AlN interposers for mounting one or more typical power transistor dice, and having tungsten internal traces, a grouping of electrically parallel vias that connect to the die bond pad of the source electrode can be a linear, one-dimensional array, or more preferably a two-dimensional array having a size of least 2×6, and more preferably at least 8×12, and typically less than 10×40. Further, each substantially cylindrically shaped via can have a diameter of between about 0.1 mm and 0.4 mm, more preferably between about 0.2 mm and 0.3 mm, and most preferably between about 0.24 mm (0.009 inch) and 0.26 mm (0.010 inch). Depending on the location of the vias in the interposer, the vias can have a length of between about 0.127 mm (0.005 inch) and 0.381 mm (0.015 inch).

As described above, a group of vias (31 for example) can be interconnected in an electrically parallel manner between the die bond pad 17 and the interposer contact pad 25. In this way the total current running between the pads can be carried collectively by the aggregate of traces. Further, in this embodiment an aggregate current flowing through the vias 31 can be substantially equal to the current flowing between the die bond pad 17 and the interposer contact pad 25. It shall be understood that the shape and number of the strips can be different than the shape and number of vias in order minimize resistance throughout the network of vias and strips. For this purpose the shape and number of strips and vias can be adjusted to provide substantially the same cross-sectional area at any given part of the network through which the total aggregate current flows.

In this way, the less conductive tungsten, which would ostensibly generate more heat, can carry the necessary current without creating additional heat due to the parallel nature of the circuitry, lowering the overall resistance of the path. It shall be noted that a single trace can include a first portion such as a via 41 that extends through the body substantially orthogonally to an adjacent second portion such as a strip 42 that also extends through the body. In this way the trace can have a non-linear shape.

Figure 5:
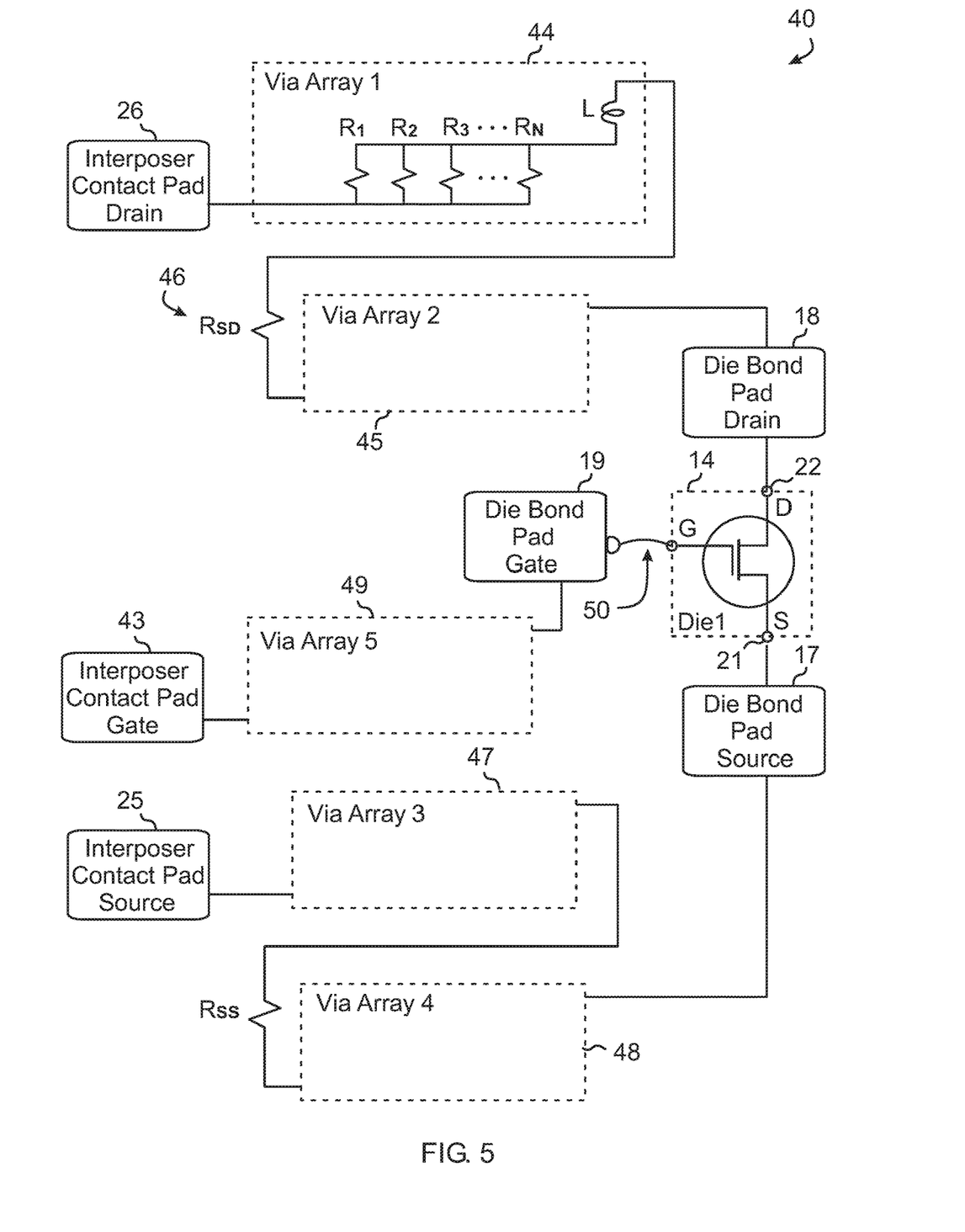
FIG. 5 is an illustrative circuit diagram of a portion of the interposer connecting to a die.

Referring now to FIG. 5, the electrical operation of a portion of the interposer can be further characterized by way of a circuit diagram 40 where a power transistor die 14 is electrically accessed through the interposer contact pads 25,26,43 which electrically connect to die bond pads 17,18, 19 through the ceramic interposer body by way of conductive metalization traces. Thus, the interposer contact pad for the drain 26 is electrically connected to a first grouping of a number N of electrically parallel vias entitled Via Array 1 44. Each successive via in the array can be characterized by a resistor $R_1$ through $R_N$ connected in parallel. The grouping of vias can also have a collective inductance characterized by an inductor L in series with the resistors. A second grouping of electrically parallel vias arranged similarly to the first grouping can be entitled Via Array 2 45 which is connected in series between Via Array 1 and the die bond pad for the drain 18. The resistance of the interconnecting strips electrically connecting Via Array 1 to Via Array 2 can be characterized as resistor RSD 46. The electrical connection between the interposer contact pad for the source 25 and the die bond pad for the source 17 can be similarly characterized by a third via array entitled Via Array 3 47 connected in series through interconnecting strips having a collective resistance Rss with a fourth via array entitled Via Array 4 48. The interposer contact pad for the gate 43 can connect to a die bond pad for the gate 19 through Via Array 5. A wire bond 50 for example can connect the gate of the die to the die bond pad for the gate.

Figure 6:
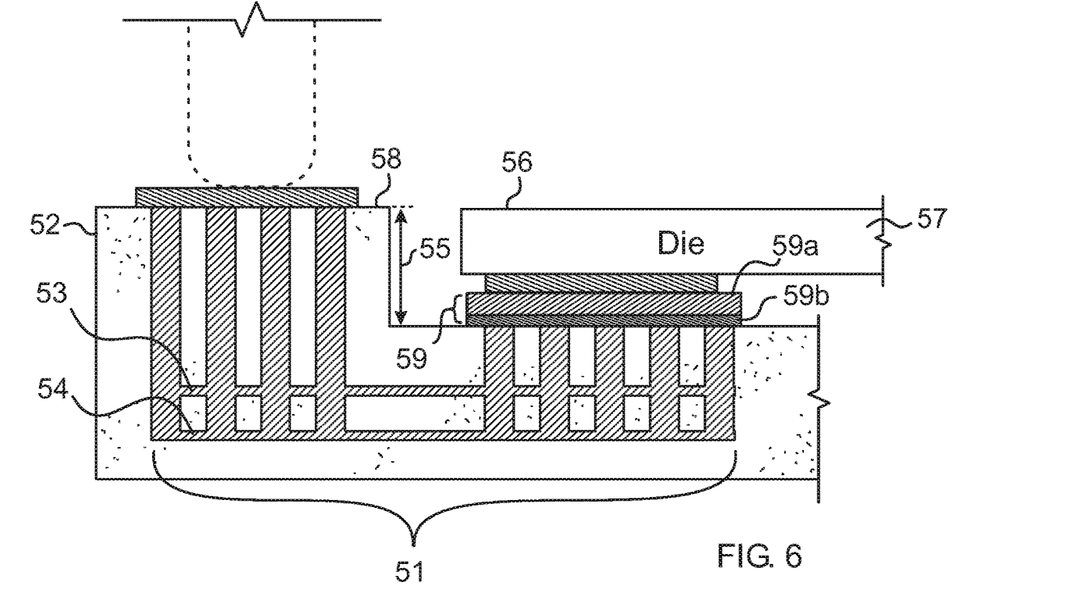
FIG. 6 is a diagrammatic partial cross-sectional view of an alternate interposer having a plurality of stratified internal lateral metalized strips.

As shown in FIG. 6, the conductive traces 51 coursing internally through the interposer body 52 can have a plural number of stratified, laterally extending interconnecting metalization strips 53,54. In other words, the traces can form a three-dimensional network of internal conductive metalization to accommodate the necessary current.

An advantage of the above described interposer architecture embodiments is that they can readily accommodate a heat management structures such as heat sinks and radiators being mounted to multiple surfaces of the interposer through brazing, soldering, or otherwise physical mating of precisely flat surfaces to aid in the spreading and extraction of heat. The depth of the cavity 55 can be selected so that the upper surface 56 of the die 57 is substantially flush with the upper surface of 58 of the interposer body 52 to provide for flatness across the exposed surfaces of die and interposer.

It is critical that there be a robust electrical connection between the external, surface metalization, such as the die bond and interposer contact pads, and the internal metalization such as the via arrays. Thus, as further shown in FIG. 6, bust which is applicable to all embodiments, each pad 59 can include an outer layer 59a of tungsten, copper, silver, silver palladium, and alloys thereof, and an inner, adhering layer 59b of material such as nickle, tungsten, and alloys thereof which can be plated and diffused into the exposed surfaces of the internal metalization beneath the pad and form a more robust adhering interface with the outer layer.

Figure 7:
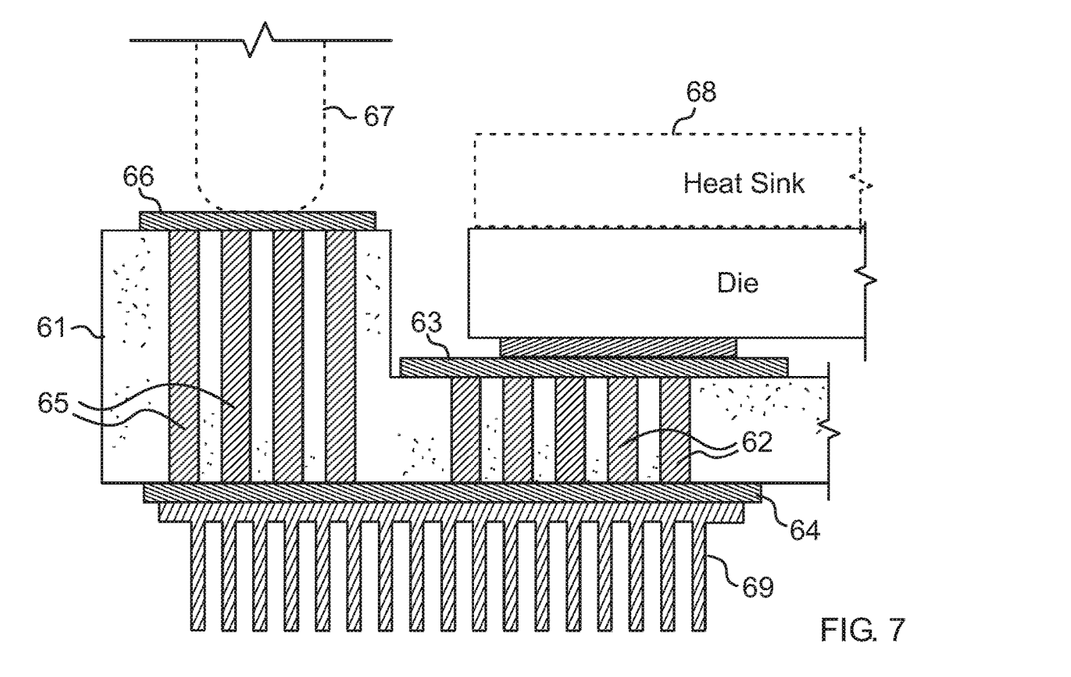
FIG. 7 is a diagrammatic partial cross-sectional view of an alternate interposer having bridging surface metalization and heat management structures.

As shown in FIG. 7, the internal traces of a MLC interposer body 61 can be subdivided into a first set of tungsten vias 62 which connect, in an electrically parallel manner, a die bond pad 63 to a bridge pad 64 located on another surface of the body. The bridge pad can connect to a second set of tungsten vias 65 which run back through the body to an interposer contact pad 66 on another surface of the body to be engaged by an interconnecting pin 67. In this way, two opposite surfaces of the interposer can be provided for contacting heat management structures such as a heat sink 68 and radiator 69. Running the power transmission traces internally also frees up interposer surfaces for mounting control circuitry such as die gate connections or additional dies mounted on other surfaces apart from the primary power transistor cavities.

Another advantage of the above described interposer architecture is that it can readily accommodate a network of cooling conduits and optional, so-called "resistance temperature detector" ("RTD") traces coursing through other internal parts of the interposer so that the interposer can provide controlled active cooling to the mounted dice.

Figure 8:
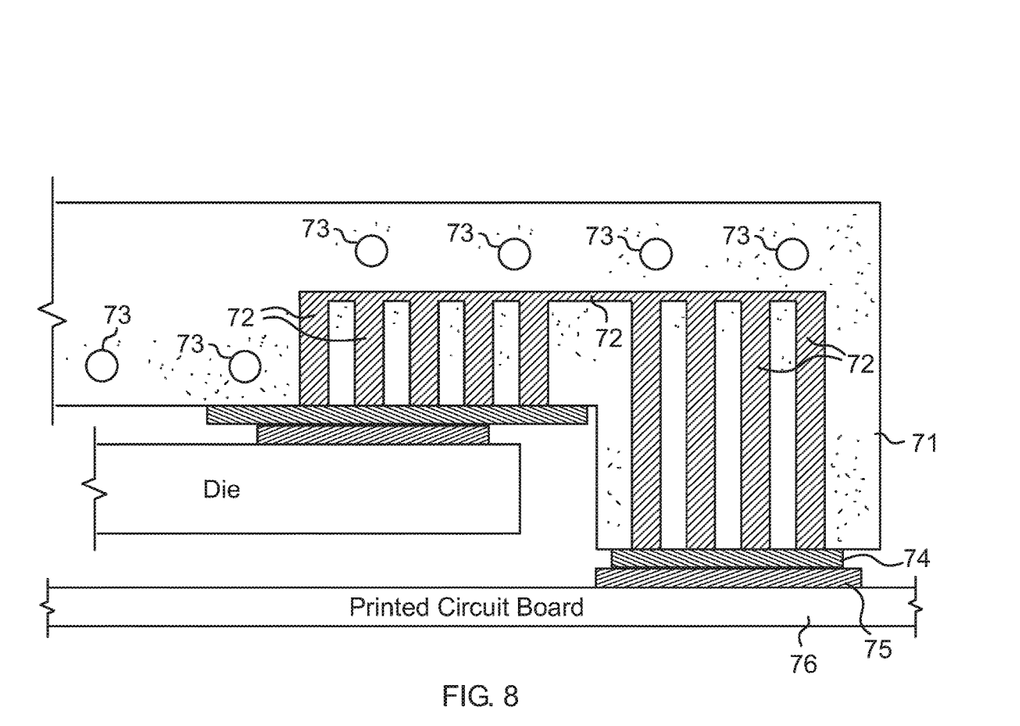
FIG. 8 is a diagrammatic cross-sectional view of an alternate interposer having cooling fluid carrying conduits and inverted to surface mount upon a printed circuit board.

As shown in FIG. 8, in addition to the internal electrically conductive traces 72, a MLC interposer body 71 can further include a network of hollow cooling conduits 73 that can carry a flow of cooling fluid such as air or engineered thermal transfer liquids such as Novec brand engineered fluids available from the 3M Company of Maplewood, Minnesota Such active cooling can greatly enhance the thermal transfer capability of the interposer support structure.

It shall be understood that the above network of conduits can have their geometry adjusted to adjust the flow of fluid to regions of the interposer requiring more rapid cooling.

A further advantage of the above interposer is that the amount of cooling fluid sent through the cooling conduits can be adjusted in response to the temperature detected by the RTD traces. In this way controlled active cooling can be accomplished so as to operate the device or devices in a preferred temperature range.

Further, the interposer in FIG. 8 is shown in an inverted orientation allowing it to be surface mounted to a printed circuit board 76 where its interposer contact pads 74 can bond directly to conductive mounting pads 75 on the circuit board, thereby avoiding the necessity for electrical interconnection through pins or wire bonds, and helping alleviate the parasitic inductance plaguing such connections.

Figure 9:
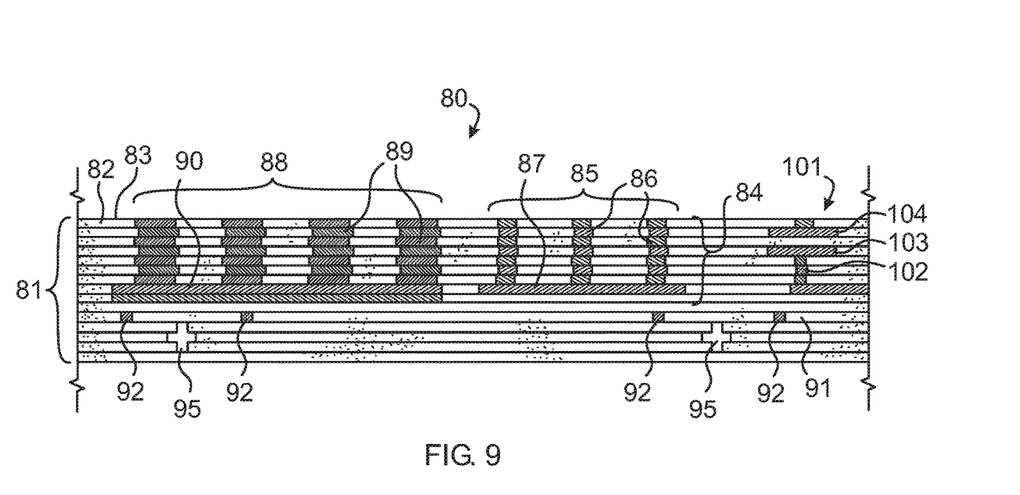
FIG. 9 is a diagrammatic cross-sectional view of a stylized stack of MLC layers for forming an interposer according to an exemplary embodiment of the invention.

Referring primarily now to FIG. 9, the interposer 80 can be manufactured using a multi-layer ceramic ("MLC") process by stacking, laminating and sintering a number of "green tape" layers 81. For simplicity a minimum number of layers are shown in the drawing. Those skilled in the art will understand that each layer can represent one or more layers of stacked green tape. Some of the layers are screened and metalization imprinted thereon to form the electrical traces and interconnections within the interposer body. Those skilled in the art will further understand the simplified, stylized nature of the drawing for showing structures described. The physical geometries are often significantly more complex. Further, those skilled in the art will appreciate that machining can remove many layers that appear in the green state of the manufacturing process to form complex internal and external structures including the die cavities and internal cooling conduits and external cooling channels.

A first interface layer 82 can form the platform surface 83 of the cavity which interfaces with the substantially flat backing surface of the bond pad surface metalization. The interface layer can also hermetically seal the internal metalization of the interposer body from the outside environment.

A number of power trace layers 84 can carry the metalized traces forming the high-current-carrying electrical interconnects for the power dice. For higher currents the size and/or number of traces can be increased. For example, a relatively lower current carrying portion 85 of the circuitry can have narrower vias 86 and thinner strips 87, whereas relatively higher current-carrying portion 88 of the circuitry can have more and thicker vias 89, and wider and thicker lateral strips 90.

In addition to the metalization via arrays intended to provides high conductance, the shape and dimensioning of the traces can be adjusted to provide greater resistance, in essence providing for resistors in the internal circuitry of the interposer. Further, structures such as capacitors can be can provided by creating locally larger, and narrowly spaced apart structures. For example, a so called snubber circuit 101 consisting of a resistor and capacitor in series can be formed by a tungsten trace structure that provides electrical resistance and capacitance functions. A relatively narrow trace 102 can form the resistor while a pair of narrowly spaced apart paddle structures 103,104 can form the capacitor.

Vertically spaced apart from the power trace layers 84 is a temperature sensor layer 91 including a serpentine RTD trace 92 electrically connected across the layers of the interposer through metalized vias to surface metalized RTD contact lands on exposed surfaces of the interposer. Vias 95 can be formed in other layers, which after sintering form channels or conduits for carrying cooling fluids. Alternately, cooling conduits can be machined into the interposer body after sintering.

A number of intermediate layers can separate the power trace layers from the rest of the interposer body and add thickness to the body for structural integrity purposes, to enhance hermeticity, and to improve electrical isolation. For clarity, the intermediate layers are not shown in FIG. 9.

In the above embodiment, the power traces can be said to be in thermal communication with the RTD traces and cooling conduit structures due to their mutual proximity.

Although the above embodiments utilize the stacking of substantially planar layers of green tape, the topographically similar layers can have three-dimensional shapes such as nested curves, saddles, coaxial cylinders, or co-centric spheres for example. In this way, more complexly-shaped interposers and interposer sections can be formed.

A further advantage of the presently described interposer is it can be readily scaled to variously sized and multiple dies.

Figure 10:
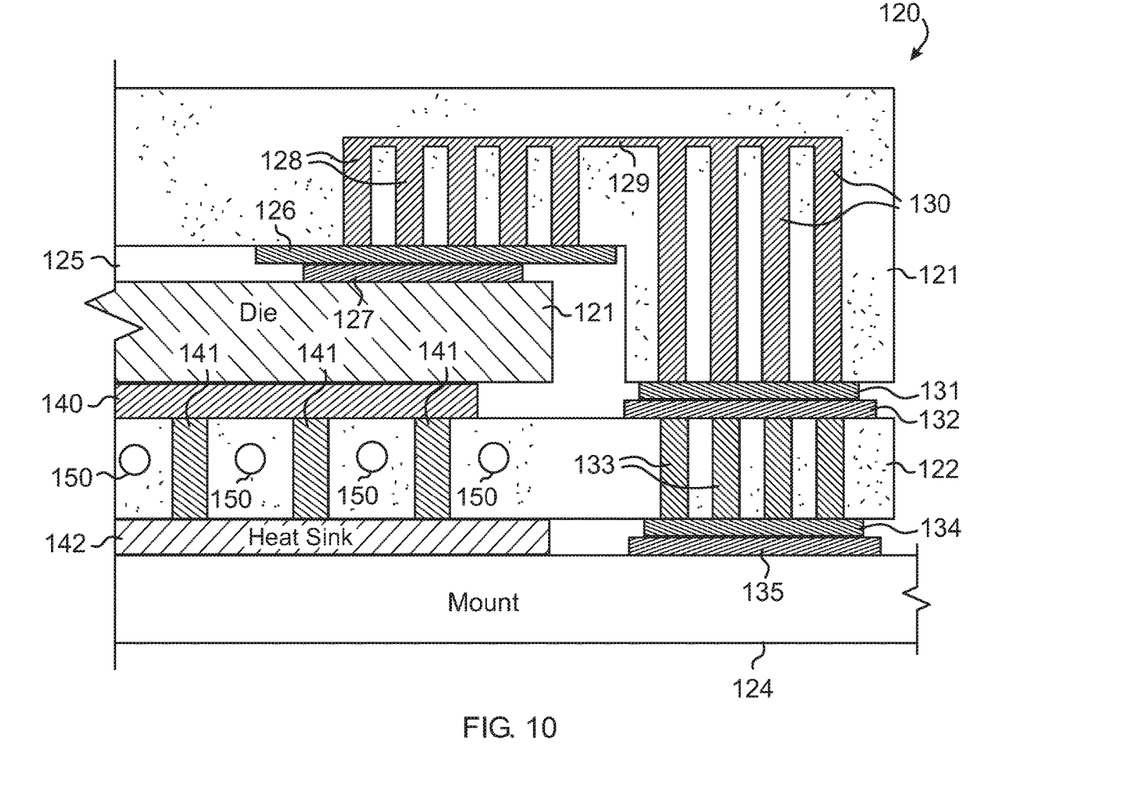
FIG. 10 is a diagrammatic cross-sectional side view of an alternate interposer having a pair of body structures bonded together and surface mounted to a printed circuit board.

As shown in FIG. 10, the interposer 120 can include a plural number of separately formed, MLC created, monolithic bodies 121,122 that can be bonded together to form an interposer package that can substantially enclose one or more dice 123 within one or more internal cavities 125 so that the interposer package can be surface mounted to a printed circuit board 124. The word "substantially" is used because in some circumstances small gaps can form between the bonded bodies. The bodies can be bonded along a bond interface which can including metalization pads 131,132 which can contact one another to allow for electrical communication between the bodies. Similar to earlier embodiments, the upper body 121 can include one or more die bond pads 126 for contacting corresponding electrodes 127 on the die. These die bond pads can be electrically connected to interposer bonds pads 131 through via arrays 128,130 and interconnecting strips 129. The lower body 122 can include electrical interface pads 132 which electrically connect to mounting pads 134 through internal traces such as one or more arrays of electrically parallel vias 133. The mounting pads provide electrical contact to conductive pads 135 on the mount 124 to which the interposer is ultimately attached, such as a printed circuit board, a distribution block made of AlN or other material, or other structure.

The lower interposer body 122 can also include one or more thermally conductive plates 140 for physically contacting the surface of the die 121. The thermally conductive plates can physically connect to a thermally conductive array of vias 141 made of thermally conductive material such as tungsten extending through the lower body to physically contact a heat sink 142 formed on the opposite side of the lower body. The heat sink can physically contact other structures such as radiators associated with the mount 124 in order to further carry away or dissipate the heat generated by the dice. Similar to the embodiment of FIG. 8, a number of cooling conduits 150 can be formed in the lower interposer body in close proximity to the thermally conductive vias. Indeed, the spaced apart vias can be interleaved by a network of conduits to enhance removal of heat from the thermally conductive via array.

Figure 11:
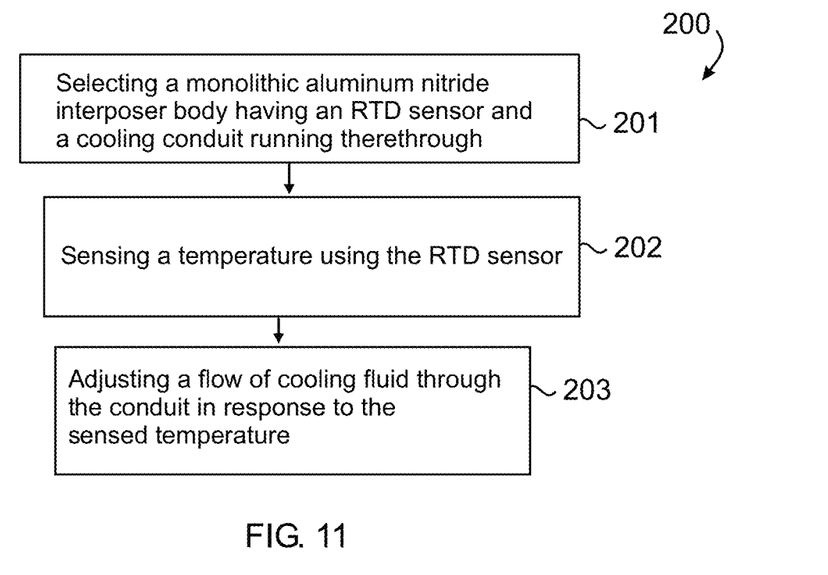
FIG. 11 is a flow chart diagram of a power electronic interposer cooling method according to an exemplary embodiment of the invention.

Referring now to FIG. 11, there is disclosed a method 200 for operating a power electronic interposer. The method includes selecting 201 a monolithic aluminum nitride interposer body having an RTD temperature sensor trace and a cooling conduit running through the body. A temperature of the interposer is sensed using the RTD sensor 202. Thereafter, the flow of cooling fluid flowing through the conduit is adjusted in response to the sensed temperature 203. For example, the sensor can detect a temperature at the high range of allowable temperatures. In response to this detecting the flow of fluid through the conduit is increased. The above process can result in a bonded die operating in a more uniformly controlled temperature environment, and thus provide more precise and accurate performance.

Figure 12:
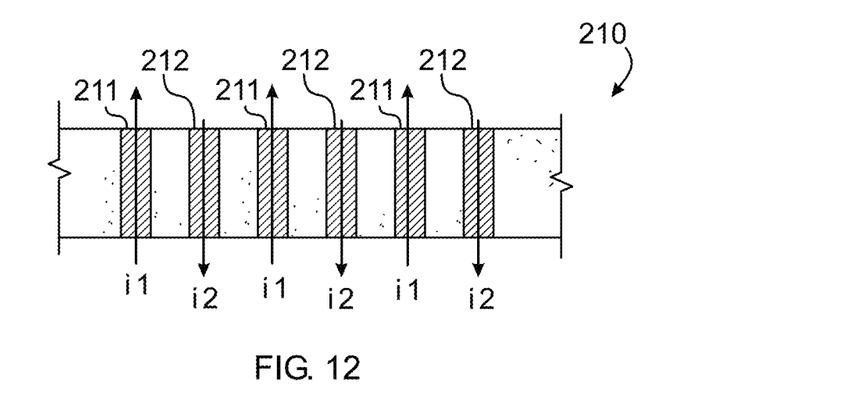
FIG. 12 is a diagrammatic partial cross-sectional side view of an interposer portion having two sets of interleaved vias carrying current in opposite directions.

Referring now to FIG. 12 there is shown a section of the interposer 210 where a first set of traces 211 is wired so that each via carries the current i in a first direction i1, and a second set of traces 212 interleaved with the first set of traces is wired so that each via carries the current second direction i2 opposite said first direction.

Example 1

A multi-layer ceramic (MLC) produced aluminum nitride (AlN) interposer according to a design of the type diagramed in FIG. 1, mounts a pair of 650 volt, 150 amp gallium nitride (GaN) power dice wired together in either a Y or W configuration to make a 3-phase traction inverter. For each die, the interposer includes a pair of copper mounting pads, each of which contacts the die. Internally, each die mounting pad is connected electrically to a copper interposer contact pad on the surface of the interposer spaced apart from the die. Electrical connection is accomplished by tungsten traces running through the AlN body of the interposer. The traces include a first grouping of substantially physically parallel and electrically parallel, substantially uniformly shaped and dimensioned, spaced apart vias. The vias are arranged in a two dimensional array that has 5 rows and 23 columns. The first grouping of vias are substantially square packed and have a minimum spacing of no more than 0.6 mm (0.025 inch). Each of the vias is substantially cylindrical having a diameter of about 0.25 mm (0.010 inch) and a length of about 0.25 mm (0.010 inch) corresponding to two stacked green sheets which are about 0.125 mm (0.005 inch) thick. The first grouping of vias exhibit a collective resistance of no more than 0.01 Ohm and an inductance of no more than $3.0 \times 10^{-9}$ Henry.

It shall be understood that other MLC electronic mounting packages can be fabricated using the above-described structures to mount other types on integrated circuit dice such as radio frequency communication chips, amplifier chips, and microprocessor chips to name a few. Interposers mounting these types of dice can be similar to the high power interposer described in FIG. 1 however, the vias can be more slender, and more closely packed to accommodate more interconnections and smaller currents.

While the preferred embodiment of the invention has been described, modifications can be made and other embodiments may be devised without departing from the spirit of the invention and the scope of the appended claims.

What is claimed is:

1. A solid state power electronic apparatus for mounting at least one power electronic die, said apparatus comprises:
a ceramic body;
a resistance temperature detector trace coursing through said body;
a platform on a first surface of said ceramic body;
said platform including a first metal pad oriented to electrically contact said at least one power electronic die;
a second metal pad on a second surface of said ceramic body spaced apart from said first surface;
a first set of plural electrically conductive traces running internally through said ceramic body electrically connected between said first metal pad and said second metal pad;
wherein said first set of plural electrically conductive traces comprise a first array of spaced apart, thermally conductive vias;
wherein each of said thermally conductive vias are connected to one another in an electrically parallel circuit configuration;
a network of hollow conduits extending through said ceramic body adjacent to said vias;
wherein said network carries a flow of cooling fluid; and,
wherein said second metal pad provides an electrical contact to circuitry off said ceramic body.

2. The apparatus of claim 1, wherein said ceramic body comprises aluminum nitride and said first set of a plurality of electrically conductive traces comprise tungsten.

3. The apparatus of claim 1, wherein said platform is formed within a cavity on said ceramic body.

4. The apparatus of claim 1, wherein at least one of said first set of plural electrically conductive traces has a first portion and a second portion adjacent to said first portion; wherein said first and second portions extend through an internal section of said body; and, wherein said first portion is substantially orthogonal to said second portion.

5. The apparatus of claim 1, wherein said first array of spaced apart thermally conductive vias is two dimensional.

6. The apparatus of claim 5, wherein said first array has a size of at least 2×6.

7. The apparatus of claim 1, wherein said first set of plural electrically conductive traces further comprises a plurality of lateral strips extending through said ceramic body, wherein a first one of said thermally conductive vias and a first one of said lateral strips are electrically connected and are arranged in a non-linear physical shape.

8. The apparatus of claim 7, wherein a cross-sectional area of said first one of said lateral strips taken perpendicular to a current flow through said first one of said lateral strips is greater than a cross-sectional area of said first one of said thermally conductive vias taken perpendicular to a current flow through said first one of said thermally conductive vias.

9. The apparatus of claim 1, which further comprises:
said ceramic body being formed by a sintered plurality of multilayer ceramic layers comprising:
aluminum nitride; and,
said first set of plural electrically conductive traces comprising tungsten; and,
at least one of said hollow conduits extends through a plurality of adjacently stratified ones of said ceramic layers.

10. The apparatus of claim 1, wherein said first metal pad comprises an outer layer comprising copper and an inner adhering layer comprising nickel.

11. The apparatus of claim 1, which further comprises:
said ceramic body being a first ceramic body;
a second ceramic body bonded to said first ceramic body along a bond interface;
wherein said bond interface comprises a plurality of metal pads electrically connecting said first ceramic body to said second ceramic body; and,
wherein said bodies substantially enclose said die.

12. The apparatus of claim 1, which further comprises:
a second array of spaced apart thermally conductive vias;
a second network of hollow conduits extending through said ceramic body;
wherein said second network of hollow conduits carries a flow of cooling fluid;
and,
wherein said second array of spaced apart thermally conductive vias is interleaved with said second network of hollow conduits.

13. The apparatus of claim 1, wherein said cooling fluid comprises air.

14. A solid state power electronic apparatus for mounting at least one power electronic die, said apparatus comprises:
a ceramic body;
a platform on a first surface of said ceramic body;
said platform including a first metal pad oriented to electrically contact said at least one power electronic die;
a second metal pad on a second surface of said ceramic body spaced apart from said first surface;
a first set of plural electrically conductive traces running internally through said ceramic body electrically connected between said first metal pad and said second metal pad;
wherein said first set of plural electrically conductive traces comprise a first array of spaced apart, thermally conductive vias;
wherein each of said thermally conductive vias are connected to one another in an electrically parallel circuit configuration;
a network of hollow conduits extending through said ceramic body adjacent to said vias;
wherein said network carries a flow of cooling fluid;
wherein said second metal pad provides an electrical contact to circuitry off said body;
a third metal pad on a third surface of said ceramic body spaced apart from said first and second surfaces;
a second set of plural electrically conductive traces running internally through said ceramic body electrically connecting said second metal pad with said third metal pad; and,
wherein said second set of plural electrically conductive traces comprise a second array of spaced apart vias connected in an electrically parallel circuit configuration.

15. The apparatus of claim 14, wherein said apparatus further comprises:
a heat management structure contacting said third metal pad; and,
wherein said heat management structure is selected from the group consisting of:
a heat sink, a radiator, and a cooling fan.

16. The apparatus of claim 14, wherein said third metal pad is electrically connected to a transistor source electrode or drain electrode on said die.

17. A solid state power electronic apparatus for mounting at least one power electronic die, said apparatus comprises:
a ceramic body;
a platform on a first surface of said ceramic body;
said platform including a first metal pad oriented to electrically contact said at least one power electronic die:
a second metal pad on a second surface of said ceramic body spaced apart from said first surface;
a first set of plural electrically conductive traces running internally through said ceramic body electrically connected between said first metal pad and said second metal pad;
wherein said first set of plural electrically conductive traces comprise a first array of spaced apart, thermally conductive vias;
wherein each of said thermally conductive vias are connected to one another in an electrically parallel circuit configuration;
a network of hollow conduits extending through said ceramic body adjacent to said vias;
wherein said network carries a flow of cooling fluid;
wherein said second metal pad provides an electrical contact to circuitry off said ceramic body; and,
a tungsten snubber circuit element electrically connected to said first set of plural electrically conductive traces.

18. A method for operating a solid state power electronic interposer mounting one or more integrated circuit dice, said method comprises:
selecting a monolithic, multilayer ceramic aluminum nitride interposer body having a resistance temperature detector sensor trace and a cooling conduit running through the monolithic,multilayer ceramic aluminum nitride interposer body;
sensing a temperature of said ceramic aluminum nitride interposer monolithic multilayer interposer body using said resistance temperature detector sensor trace; and,
adjusting a flow of cooling fluid through said cooling conduit in response to said temperature.

19. The method of claim 18, wherein said cooling conduit runs between a pair of heat conductive vias extending through said monolithic, multilayer ceramic aluminum nitride interposer body.

20. The method of claim 18, which further comprises:
cooling said dice through a plurality of spaced apart tungsten vias running through said monolithic, multilayer ceramic aluminum nitride interposer body adjacent to said cooling conduit;
wherein said tungsten vias are wired in an electrically parallel circuit configuration.

* * * * *